United States Patent
Cha et al.

(10) Patent No.: US 7,470,603 B2
(45) Date of Patent: Dec. 30, 2008

(54) METHODS OF FABRICATING SEMICONDUCTOR DEVICES HAVING LASER-FORMED SINGLE CRYSTALLINE ACTIVE STRUCTURES

(75) Inventors: Yong-Won Cha, Gyeonggi-do (KR); Sung-Kwan Kang, Gyeonggi-do (KR); Pil-Kyu Kang, Gyeonggi-do (KR); Yong-Hoon Son, Gyeonggi-do (KR); Jong-Wook Lee, Gyeonggi-Do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/701,694

(22) Filed: Feb. 2, 2007

(65) Prior Publication Data

US 2008/0014726 A1 Jan. 17, 2008

(30) Foreign Application Priority Data

Jul. 12, 2006 (KR) .................. 10-2006-0065281

(51) Int. Cl.
*H01L 21/00* (2006.01)
(52) U.S. Cl. .................. 438/487; 257/E21.001
(58) Field of Classification Search .......... 438/487; 257/E21.001
See application file for complete search history.

(56) References Cited

U.S. PATENT DOCUMENTS

| | | | |
|---|---|---|---|
| 4,565,584 A | 1/1986 | Tamura et al. | |
| 4,751,193 A * | 6/1988 | Myrick | 117/44 |
| 6,214,653 B1 * | 4/2001 | Chen et al. | 438/153 |
| 6,506,661 B1 | 1/2003 | Chang et al. | |
| 6,594,446 B2 * | 7/2003 | Camm et al. | 392/416 |
| 6,919,260 B1 * | 7/2005 | Umezawa et al. | 438/438 |
| 2002/0025659 A1 * | 2/2002 | Yamazaki et al. | 438/487 |
| 2006/0228897 A1 * | 10/2006 | Timans | 438/758 |

FOREIGN PATENT DOCUMENTS

| | | |
|---|---|---|
| JP | 05-198665 A | 8/1993 |
| JP | 06-120332 A | 4/1994 |
| JP | 06-236996 A | 8/1994 |

(Continued)

OTHER PUBLICATIONS

Notice of Reasons for Refusal, KR 10-2006-0065281, Jun. 27, 2007.

*Primary Examiner*—Matthew Smith
*Assistant Examiner*—Walter H Swanson
(74) *Attorney, Agent, or Firm*—Myers Bigel Sibley & Sajovec, P.A.

(57) ABSTRACT

Methods of fabricating a semiconductor device are provided. A semiconductor substrate is provided that includes a single crystalline structure within at least a defined region thereof. A thin layer is formed on the semiconductor substrate. The thin layer is patterned to form a plurality of spaced apart field structures and to expose therebetween portions of the semiconductor substrate having the single crystalline structure. A non-crystalline layer is formed on the exposed portions of the semiconductor substrate having the single crystalline structure. The non-crystalline layer is planarized to expose upper surfaces of the field structures and define non-crystalline active structures from the non-crystalline layer between the field structures. A laser beam is generated that heats the non-crystalline active structures to change them into single crystalline active structures having substantially the same single crystalline structure as the defined region of the semiconductor substrate.

27 Claims, 5 Drawing Sheets

FOREIGN PATENT DOCUMENTS

| | | |
|---|---|---|
| JP | 09/148426 A | 6/1997 |
| JP | 2000-100931 A | 4/2000 |
| JP | 2001-015591 A | 1/2001 |
| JP | 2003-078000 A | 3/2003 |
| JP | 2003-100861 A | 4/2003 |
| JP | 2005-057147 A | 3/2005 |
| JP | 2005-327867 A | 11/2005 |
| KR | 59-194445 | 11/1984 |
| KR | 39429 B1 | 10/1990 |
| KR | 1999-0060858 A | 7/1999 |
| KR | 2001-0036283 A | 5/2001 |
| KR | 2001-0063864 A | 7/2001 |
| KR | 2002-0002543 A | 1/2002 |
| KR | 2002-0049349 A | 6/2002 |
| KR | 10-0402101 B1 | 10/2003 |
| KR | 10-0449320 B1 | 9/2004 |
| KR | 10-2004-0103557 A | 12/2004 |
| KR | 10-0548574 B1 | 1/2006 |

\* cited by examiner

METHODS OF FABRICATING SEMICONDUCTOR DEVICES HAVING LASER-FORMED SINGLE CRYSTALLINE ACTIVE STRUCTURES

CROSS-REFERENCE TO RELATED APPLICATION

This application claims priority under 35 U.S.C. § 119 to Korean Patent Application No. 10-2006-65281, filed on Jul. 12, 2006, the disclosure of which is hereby incorporated herein by reference in its entirety.

FIELD OF THE INVENTION

The present invention relates to methods of fabricating semiconductor devices, and more particularly, to methods of fabricating single crystalline active structures in semiconductor devices.

BACKGROUND

To avoid interference among adjacent integrated circuit devices, it is desirable to utilize an isolation technique to electrically and/or structurally isolate active regions on which devices are formed. To increase integration density, it is desirable to reduce not only the dimensions of the devices, but also the area and width of isolation regions between the devices. How the isolation regions are formed may limit integration density, may affect the reliability of the devices, and/or may affect the performance of the devices.

Trench isolation techniques, including shallow trench isolation (STI) techniques, are widely used to isolate integrated circuit devices. A trench isolation technique can include forming a hard mask pattern that exposes field regions and covers active regions of a semiconductor substrate. The exposed field regions can be etched using the hard mask pattern as an etching mask to form trenches in the semiconductor substrate. The trenches can then be filled with an insulating material to form an isolation structure between devices.

However, as integration density is increased, it may be desirable to reduce the pitch of the hard mask pattern and to narrow the associated widths of the trenches formed in the field regions. Consequently, the aspect ratio of the height divided by the width of the trenches typically increases with increased integration density. It can become increasingly difficult to fill narrow trenches having a high aspect ratio, which may lead to unwanted voids and discontinuities in the insulating regions.

Some insulating films that may be used to attempt to fill high aspect ratio trenches include silicon on glass (SOG), undoped silicon glass (USG), and high density plasma (HDP) oxide. Some undesirable characteristics of these films may include that HDP oxide processes can be relative complex and expensive, and SOG and USG processes can require high temperatures that may introduce impurities into the semiconductor device and deteriorate its electrical characteristics.

Trenches can also be formed over active regions of a semiconductor substrate. As with the isolation trenches, trenches over the active regions can be difficult to fill as the device integration density is increased. In some semiconductor devices it can be desirable to form the semiconductor substrate with a single crystalline structure, and to fill the trenches over the active regions with a material having the same single crystalline structure as the semiconductor substrate. A selective epitaxial growth (SEG) process may be carried out in the trenches over the active regions to grow a layer having the same single crystalline structure as the semiconductor substrate. However, the high temperatures associated with an SEG process may also introduce impurities into the semiconductor device and deteriorate its electrical characteristics.

SUMMARY

Some embodiments of the present invention are directed to methods of fabricating a semiconductor device. A semiconductor substrate is provided that includes a single crystalline structure within at least a defined region thereof. A thin layer is formed on the semiconductor substrate. The thin layer is patterned to form a plurality of spaced apart field structures and to expose therebetween portions of the semiconductor substrate having the single crystalline structure. A non-crystalline layer is formed on the exposed portions of the semiconductor substrate having the single crystalline structure. The non-crystalline layer is planarized to expose upper surfaces of the field structures and to define non-crystalline active structures from the non-crystalline layer between the field structures. A first laser beam is generated that heats the non-crystalline active structures to change them into single crystalline active structures having substantially the same single crystalline structure as the defined region of the semiconductor substrate.

In some further embodiments of the present invention, the single crystalline active structures and the field structures are planarized to align upper major surfaces of the single crystalline active structures and the field structures. A second laser beam is then generated that heats the single crystalline active structures and the field structures to a temperature that is sufficiently high to substantially reduce impurity ions in upper surfaces of the single crystalline active structures and the field structures, and that is sufficiently low to not melt the active structures. The second laser beam may be generated to heat the single crystalline active structures and the field structures to a temperature that is sufficiently high to substantially reduce hydrogen and/or carbon ions in upper surfaces of the single crystalline active structures and the field structures.

In some further embodiments, the first laser beam is generated to melt the non-crystalline active structures so that the single crystalline structure of the semiconductor substrate forms a seed layer which changes lattice parameters of the melted non-crystalline active structures to have substantially the same single crystalline structure as the defined region of the semiconductor substrate. The non-crystalline active structures may be formed from amorphous silicon and/or polycrystalline silicon, and the first laser beam may be generated to heat the non-crystalline active structures to a temperature above a melting point of silicon. The semiconductor substrate may be preheated above about 100° C. before generating the first laser beam, and may be maintained at one or more temperatures above about 100° C. while the first laser beam is generated to reduce a temperature gradient between the laser heated non-crystalline active structures and the semiconductor substrate.

In some further embodiments, the first laser beam may be generated to heat the non-crystalline active structures for a time period in a range of between about one nano-second to about 1,000 nano-seconds or, for example, for a time period in a range of between about 5 nano-seconds to about 200 nano-seconds, so that the non-crystalline active structures is maintained in a melted form for a sufficiently brief time to not flow substantially across adjacent field structures. The first laser beam may be generated using a Nd Yttrium-Aluminum-Garnet (YAG) laser apparatus, a carbon laser apparatus, and/or an excimer laser apparatus.

In some further embodiments, the non-crystalline film may be formed from a material comprising amorphous silicon and/or polycrystalline silicon. The non-crystalline film may be formed by a chemical vapor deposition (CVD) process comprising a silicon source gas including silane (SiH4) and/or hexadichlorosilane (Si2H6). The non-crystalline layer may be planarized to expose upper surfaces of the field structures by chemical mechanical polishing and/or etching the non-crystalline layer until upper surfaces of the field structures are exposed. Impurities, such as boron (B), phosphor (P), and/or arsenic (As), may be doped into the non-crystalline active structures before the first laser beam is generated to change the non-crystalline active structures into single crystalline active structures, and the impurities may be doped using an in-situ doping process and/or an ion-implantation process.

In some further embodiments, an etch stop layer may be formed on the defined region of the semiconductor substrate, where the thin layer is formed on the etch stop layer. The etch stop layer may be formed from a material having an etching selectivity relative to a material of the field structures. For example, the etch stop layer may be formed from silicon nitride and the field structures may be formed from silicon oxide.

In some further embodiments, an etch mask pattern may be formed on the thin layer, and the thin layer may be etched using the etch mask pattern as an etching mask to form the spaced apart field structures and expose therebetween portions of the etch stop layer on the semiconductor substrate. The etch mask pattern may be formed by forming an amorphous layer on the thin layer, forming a photoresist pattern on the amorphous layer and exposing regions of the thin layer over the defined region of the semiconductor substrate, and etching the amorphous layer using the photoresist pattern as an etching mask to form a hard mask pattern that exposes regions of the thin layer. The thin layer may be patterned by etching it using the hard mask pattern as an etching mask. The amorphous layer may be formed as a layer of silicon nitride on the thin layer or as a layer of amorphous carbon and a layer of silicon nitride on the thin layer. The exposed regions of the thin layer may be etched using an etching gas and/or an etching solution. The exposed portions of the etch stop layer may be removed to expose portions of the semiconductor substrate.

In some further embodiments, a spacer layer may be formed on side walls of the field structures. The spacer layer may be formed from a material having an etching selectivity relative to a material of the field structures. For example, the spacer layer may be formed from silicon nitride and/or oxynitride (SiON) and the field structures may be formed from silicon oxide. The thin layer may be formed from an oxide insulation material, such as at least one of high density plasma-chemical vapor deposition (HDP-CVD) oxide, and silicon on glass (SOG), and/or undoped silicate glass (USG).

In some other embodiments of the present invention are directed to other methods of fabricating a semiconductor device. A semiconductor substrate is provided that has a single crystalline structure within at least a defined region thereof. A thin layer is formed on the semiconductor substrate. The thin layer is patterned to form a plurality of spaced apart field structures and to expose therebetween portions of the semiconductor substrate having the single crystalline structure. An etching mask is formed on the field structures. Side walls of the field structures are etched to enlarge at least an upper portion of the trench between the field structures. A non-crystalline layer is formed on the exposed portions of the semiconductor substrate. The non-crystalline layer is planarized to expose upper surfaces of the field structures and to define non-crystalline active structures from the non-crystalline layer between the field structures. A laser beam is generated that heats the non-crystalline active structures to change them into single crystalline active structures having substantially the same single crystalline structure as the defined region of the semiconductor substrate.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" and its abbreviation "/" include any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, film or region to another element, film or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of films and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 1:
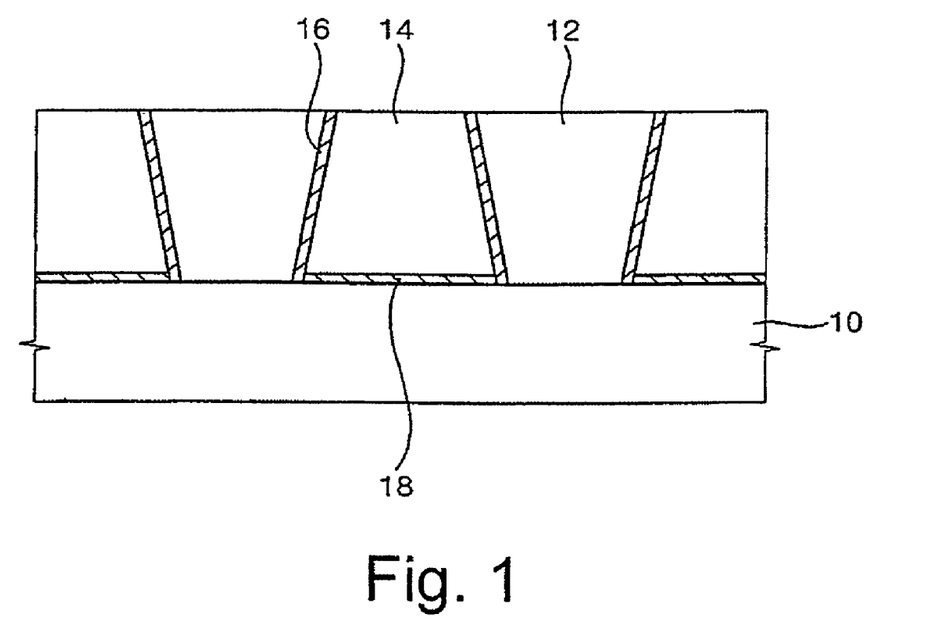
FIG. 1 is a cross-sectional view that illustrates a semiconductor device and associated methods of fabricating the same according to some embodiments of the present invention.

FIG. 1 is a cross-sectional view that illustrates a semiconductor device 100 and associated methods of fabricating the same according to some embodiments of the present invention. Referring to FIG. 1, a semiconductor substrate 10 has a single crystalline structure within at least defined regions thereof, and may have the single crystalline structure throughout. An active structure 12 is formed on an active region of the semiconductor substrate 10 that includes the single crystalline structure. A field structure 14 is formed on a field region of the semiconductor substrate 10. The field structure 14 may be formed from an insulation layer such as silicon oxide, and may have a thickness that is similar to that of a conventional trench isolation layer. The active structure 12 has substantially the same single crystalline structure as the single crystalline structure of the semiconductor substrate 10.

The active structure 12 is formed from a non-crystalline film that is heated by a laser beam to change the non-crystalline film into a single crystalline film having substantially the same single crystalline structure as the defined region of the semiconductor substrate 10. The non-crystalline film may include amorphous silicon and/or polycrystalline silicon. The laser beam is configured to melt the non-crystalline film substantially throughout, such as by heating the non-crystalline film to a temperature that is sufficient to melt amorphous silicon and/or polycrystalline silicon (e.g., above about 1410° C.). The single crystalline structure of the semiconductor substrate 10 acts as a seed layer on which the melted non-crystalline film grows, via a selective epitaxial growth (SEG) process, and changes lattice parameters of the non-crystalline film to form a single crystalline film, which can have the same crystalline structure substantially throughout.

The semiconductor device 100 may further include a spacer 16 between the active structure 12 and the field structure 14. The spacer 16 may avoid or reduce oxidation of side walls of the field structure 14 during formation of the active structure 12 and/or during laser heating of the active structure 12 when converting its non-crystalline material into a single crystalline material. The spacer 16 can insulate the active structure 12 from the field structure 14 to reduce leakage current across an interface between the active structure 12 and the field structure 14.

The spacer 16 may be formed from a material that has an etching selectivity relative to the insulation material of the field structure 14 to avoid damaging the field structure 14 when fabricating the spacer 16 using a deposition and etching process. When the field structure 14 is formed from an oxide, the spacer 16 may be formed using a nitride such as silicon nitride.

The semiconductor device 100 may further include an etch stop layer 18 between the field structure 14 and the single crystalline region of the semiconductor substrate 10. The etch stop layer 18 may be configured to avoid/prevent the covered single crystalline region of the semiconductor substrate 10 from being exposed during an etching process which may be used to form the field structure 14. The etch stop layer 18 may be formed using a material that has an etching selectivity with respect to the insulation material of the field structure 14. For example, the etch stop layer 18 may be formed using a nitride, such as silicon nitride.

FIGS. 2a-h are cross-sectional views illustrating methods of fabricating semiconductor devices, such as the semiconductor device 100 shown in FIG. 1, in accordance with some embodiments of the present invention.

Figure 2A:
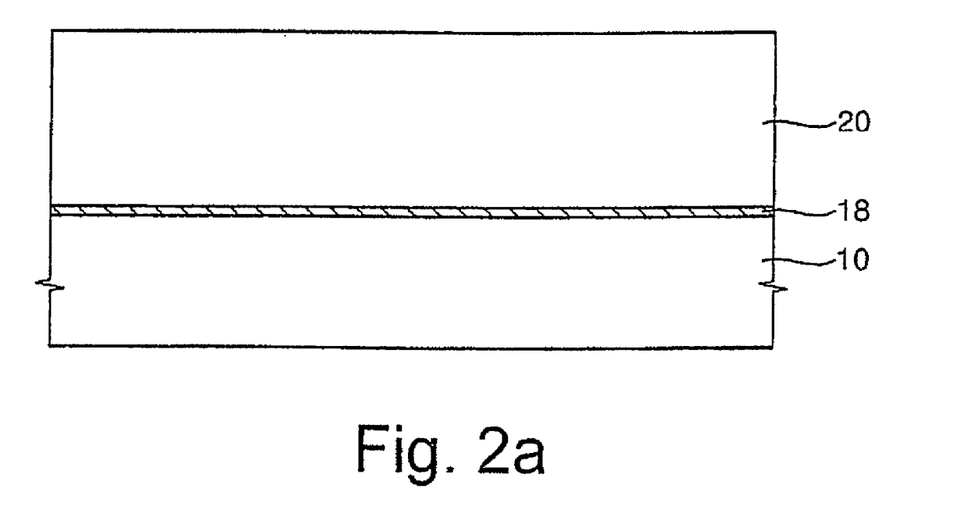
FIGS. 2a-h are cross-sectional views illustrating methods of fabricating semiconductor devices in accordance with some embodiments of the present invention.

Referring to FIG. 2a, the semiconductor substrate 10 has a single crystalline structure within at least defined regions thereof, and may have the single crystalline structure throughout. The etch stop layer 18 may be formed on the semiconductor substrate 10. The etch stop layer 18 may be formed using a nitride such as silicon nitride. A thin-film 20 is formed on the etch stop layer 18 from an insulation layer such as an oxide, for example, silicon oxide. Other exemplary oxides that may be used to form the thin-film 20 can include high density plasma-chemical vapor deposition (HDP-CVD) oxide, spin on glass (SOG), undoped silicate class (USG). The thin-film 20 may, in some embodiments, have a thickness that is similar to that of a trench isolation layer in a conventional semiconductor device.

Figure 2B:
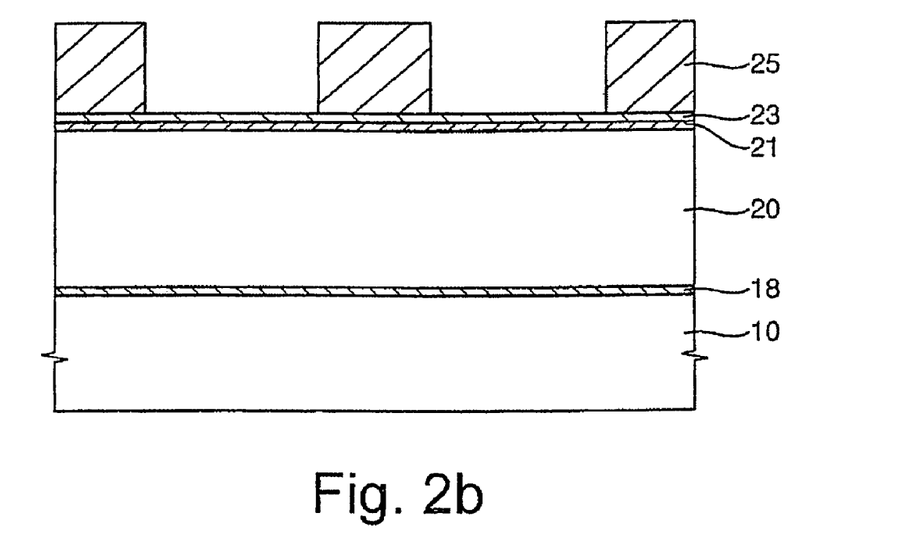

Referring to FIG. 2b, an amorphous carbon layer 21, a silicon oxynitride layer 23, and a photoresist layer are sequentially formed on the thin-film 20. The photoresist layer is patterned to form a photoresist pattern 25. The photoresist pattern 25 may expose a portions of the silicon oxynitride layer 23 over the thin-film 20 where the active structure 12 (FIG. 1) will be subsequently formed.

The silicon oxynitride layer 23 and the amorphous carbon layer 21 are sequentially etched using the photoresist pattern 25 as an etching mask to form a hard masked structure on the thin-film 20. The hard mask structure may include the patterned silicon oxynitride layer 23 and the patterned amorphous carbon layer 21. In some other embodiments, the layer 23 may be formed from silicon nitride instead of from silicon oxynitride.

Figure 2C:
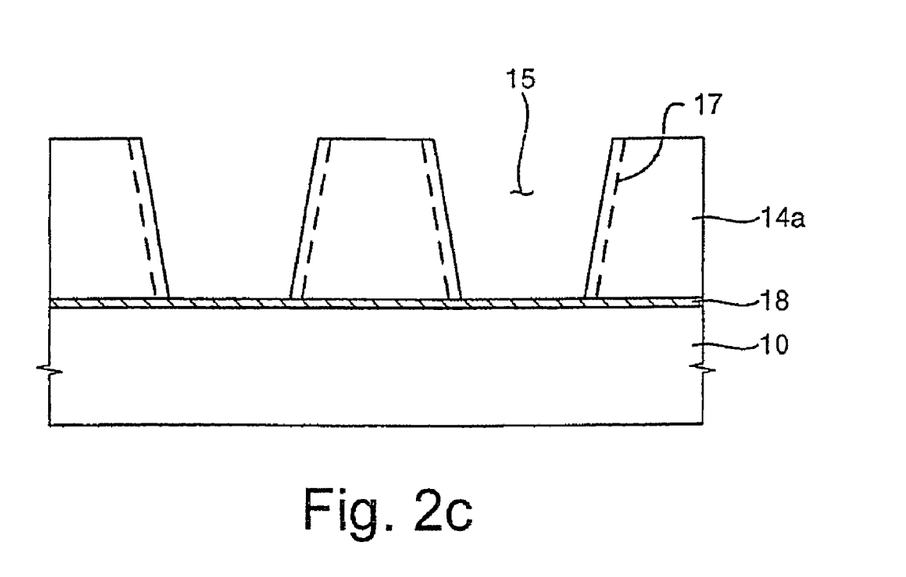

Referring to FIG. 2c, the thin-film 20 is partially etched using the hard mask structure as an etching mask to form an opening 15 and a field structure 14a. The opening 15 exposes a portion of the etch stop layer 18 over a single crystalline structure region of the semiconductor substrate 10. The thin-film 20 may be etched to form the opening 15 using an etching gas or etching solution having etching selectivity relative to the etch stop layer 18, which at least substantially prevents etching of the semiconductor substrate 10. As will be explained below, the active structure 12 can be formed in the opening 15, and may be formed over other device structures in the semiconductor substrate 10. The opening 15 may be enlarged to increase the portion of the semiconductor substrate 10 that can be exposed therethrough, and to increase the width of the active structure 12 that will be formed in the opening 15. For example sidewalls of the opening 15 may be etched using, for example, a wet etching process to form receded sidewalls 17.

Figure 2D:
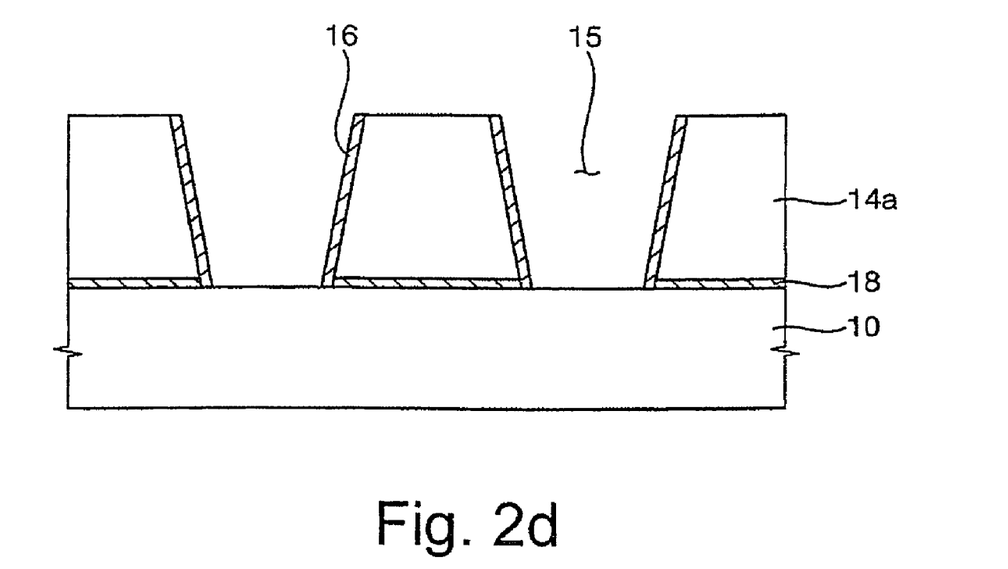

Referring to FIG. 2d, the exposed portion of the etch stop layer 18 may be removed to expose portions of the single crystalline semiconductor substrate 10. A spacer 16 may be formed on sidewalls of the opening 15 to form field structures 14a.

The spacer 16 may be formed using a nitride, such as silicon nitride. The spacer 16 may be formed by depositing a nitride layer on upper surfaces and side walls of the field structure 14a and on the exposed portions of the semiconductor substrate 10. Portions of the nitride layer are then removed from the exposed portions of the semiconductor substrate 10 and the upper surfaces of the field structure 14a using, for example, an etching process, while leaving the nitride layer on sidewalls of the field structure 14a so as to form the spacer 16.

Although various embodiments are described herein that include the spacer 16, it is to be understood that in some other embodiments the spacer 16 may be omitted. For example, although the spacer 16 may provide desirable isolation between the active structure 12 in the field structure 14 when used in DRAM type semiconductor devices, the spacer 16 may provide undesirable characteristics when used in flash memory type semiconductor devices. Accordingly, the spacer 16 may be omitted from some types of semiconductor devices.

Figure 2E:
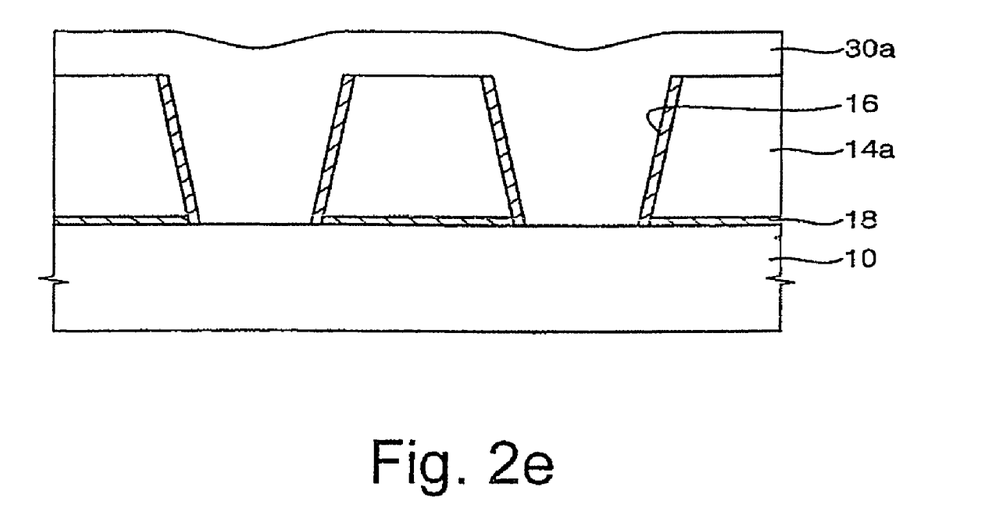

Referring to FIG. 2e, a non-crystalline film 30a is formed on the exposed portions of the semiconductor substrate 10 and fills the openings 15 in the lower insulating film pattern 103 and across the field structures 14a. The non-crystalline film 30a may be formed, for example, by depositing amorphous silicon and/or polycrystalline silicon across the semiconductor substrate 10, such as through a chemical vapor deposition (CVD) process using a silicon source gas that contains silane (SiH4) and/or hexadichlorosilane (Si2H6).

Figure 2F:
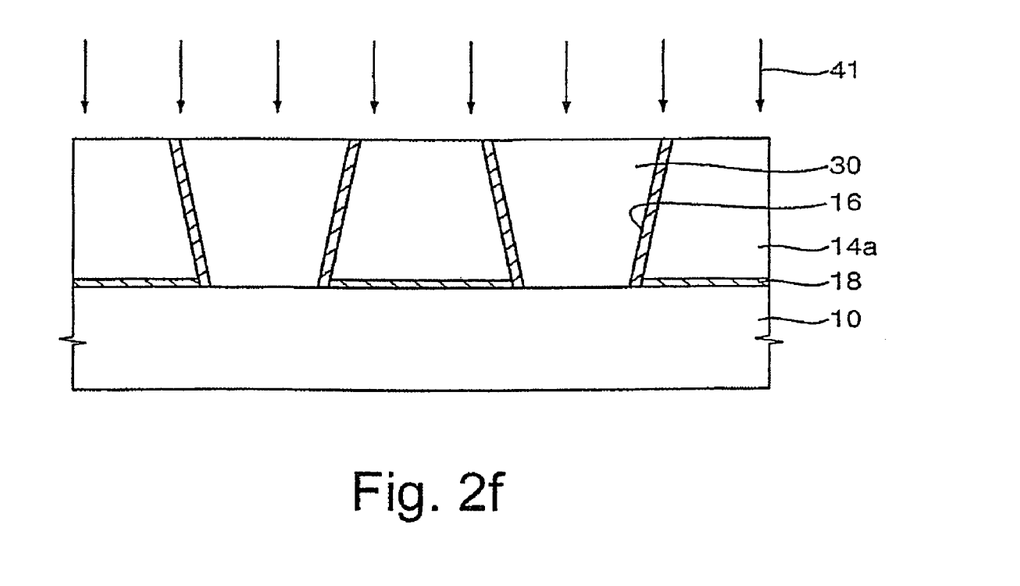

Referring to FIG. 2f, a portion of the non-crystalline film 30a is removed to expose upper surfaces of the field structures 14a, with the remaining portions of the non-crystalline film 30a forming an active structure 30 between adjacent pairs of the field structures 14a. Portions of the non-crystalline film 30a may be removed using a chemical mechanical polishing (CMP) process, an etch-back process, or a combination of CMP processes and etch-back processes.

The active structure 30 may entirely fill the opening 15 between adjacent pairs of the field structures 14a. Because the active structure 30 is formed from the non-crystalline film 30a, it contains the same materials as the non-crystalline film 30a, and, therefore, may include single crystalline silicon or polycrystalline silicon.

The active structure 30 may be doped with impurities that may include, but are not limited to, boron (B), phosphorus (P), and/or arsenic (As). The impurities may be doped into the active structure 30 by in-situ diffusion, ion implantation, and/or other fabrication processes. For example, impurities may be doped into the non-crystalline active structure 30 by supplying a phosphorus source gas (e.g., PH3) to dope phosphorus into the active structure 30 and/or by supplying a boron source gas (e.g., B2H6) to dope boron into the active structure 30 in-situ while depositing the non-crystalline film 30a.

Referring to FIG. 2f, a laser beam 41 is generated that melts the active structure 30 to change its phase from a solid phase to a liquid phase from its upper surface extending therethrough down to the single crystalline semiconductor substrate 10. The laser beam 41 therefore heats the active structure 30 to above its melting point, which for amorphous silicon and polycrystalline silicon may be above about 1410° C.

The single crystalline structure of the semiconductor substrate 10 forms a seed layer, which causes the lattice parameters of the melted active structure 30 to change so as to have substantially the same single crystalline structure as the semiconductor substrate 10 (e.g., via an epitaxial growth process), and thereby form a single crystalline active structure 30. The single crystalline active structure 30 may thereby have the same single crystalline structure throughout or at least across a major region thereof that is adjacent to the single crystalline structure of the semiconductor substrate 10. Moreover, impurity ions, such as hydrogen ions and/or carbon ions, contained in upper portions of the active structure 30 and the field structure 14a may be substantially reduced by the laser heating, which may improve electrical characteristics of the resulting semiconductor device 100.

The laser beam 41 may be generated to heat the non-crystalline active structure 30 for a time period of about 1 nanosecond to about 1000 nanoseconds or, more particularly, for a time period of between about 5 nanoseconds to about 200 nanoseconds, so that the non-crystalline active structure 30 is in a melted phase for a sufficiently brief time so as to not substantially flow across an upper surface of the adjacent field structure 14a.

The laser beam 41 may be generated using a Nd Yttrium-Aluminum-Garnet (YAG) laser apparatus, a carbon laser apparatus, and/or an excimer laser apparatus. The laser beam 41 may be focused on an area corresponding to individual ones, or more than one, of the active structures 30, and may be scanned across the semiconductor substrate 10 while modulating the laser beam 41 on/off to sequentially heat selected portions of the active structures 30 and convert them into single crystalline structures. For example, a YAG laser apparatus may be used to heat individual ones or simultaneously heat a relatively small number of the active structures 30, or a carbon laser apparatus or a excimer laser apparatus may be used to simultaneously heat a relatively larger number of complimentary active structures 30.

Before the non-crystalline active structure 30 is heated with the laser beam 41, the semiconductor substrate 10 may be preheated (e.g., within a furnace). Preheating the semiconductor substrate 10 reduces a relatively large temperature gradient that may otherwise result when the active structure 30 is rapidly heated by the laser beam 41 to sufficiently high temperatures to melt the active structure 30 while the temperatures of the adjacent portions of the semiconductor substrate 10 are more slowly raised from their initial temperature. The semiconductor substrate 10 may, for example, be preheated to above about 100° C. and maintained at one or more temperatures above about 100° C. while the non-crystalline active structure 30 is heated with the laser beam 41 so as to reduce the temperature gradient between the laser heated regions of the non-crystalline active structure 30 and the semiconductor substrate 10.

Figure 2G:
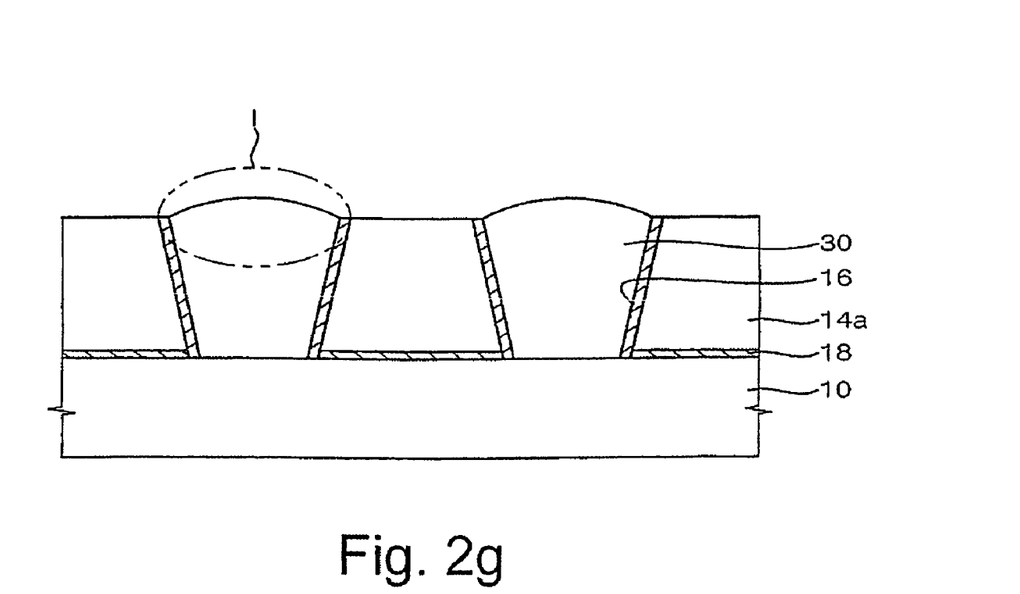

Referring to FIG. 2g, the single crystalline active structure 30 after laser heating may have a domed upper surface due to, for example, effects of surface tension while the single crystalline active structure 30 is in a melted phase. Accordingly, an upper surface of the single crystalline active structure 30 may protrude beyond an upper surface of the field structure 14a. If further structures of the semiconductor device 100 are formed on the uneven upper surface across the domed single crystalline active structure 30 and the field structure 14a, electrical characteristics of the semiconductor device 100 may be deteriorated.

Figure 2H:
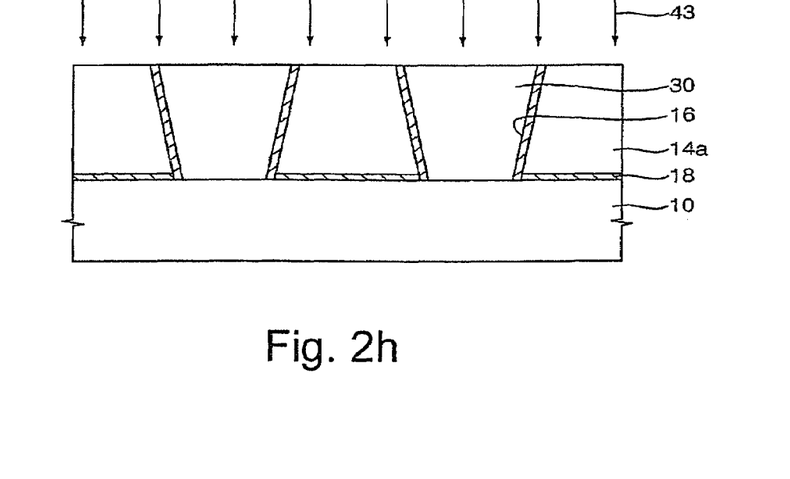

Referring to FIG. 2h, an upper surface of the single crystalline active structure 30 is planarized, such as by a chemical mechanical polishing (CMP) process, to form a single crystalline active structure 30 having an upper surface that is substantially aligned (planar) with an upper surface of the field structure 14a. The planarization process carried out on the single crystalline active structure 30 may introduce impurities, such as hydrogen ions and/or carbon ions, into an upper region of the single crystalline active structure 30 and/or the field structure 14a, and/or it may cause impurities which were not removed by the laser beam 41 to become closer to an upper surface of the planarized single crystalline active structure 30.

In accordance with some embodiments, a second laser beam 43 is generated to heat the active structure 30 and the field structure 14a to a temperature that is sufficiently high to substantially reduce impurity ions, such as hydrogen ions and/or carbon ions, in upper regions of the single crystalline active structure 30 and the field structure 14a, and that is sufficiently low to not melt the active structure 30 or the field structure 14a. Accordingly the second laser beam may be controlled to heat the active structure 30 and the field structure 14a to a temperature that may be below, and may be substantially below, about 1,410° C.

Figure 3:
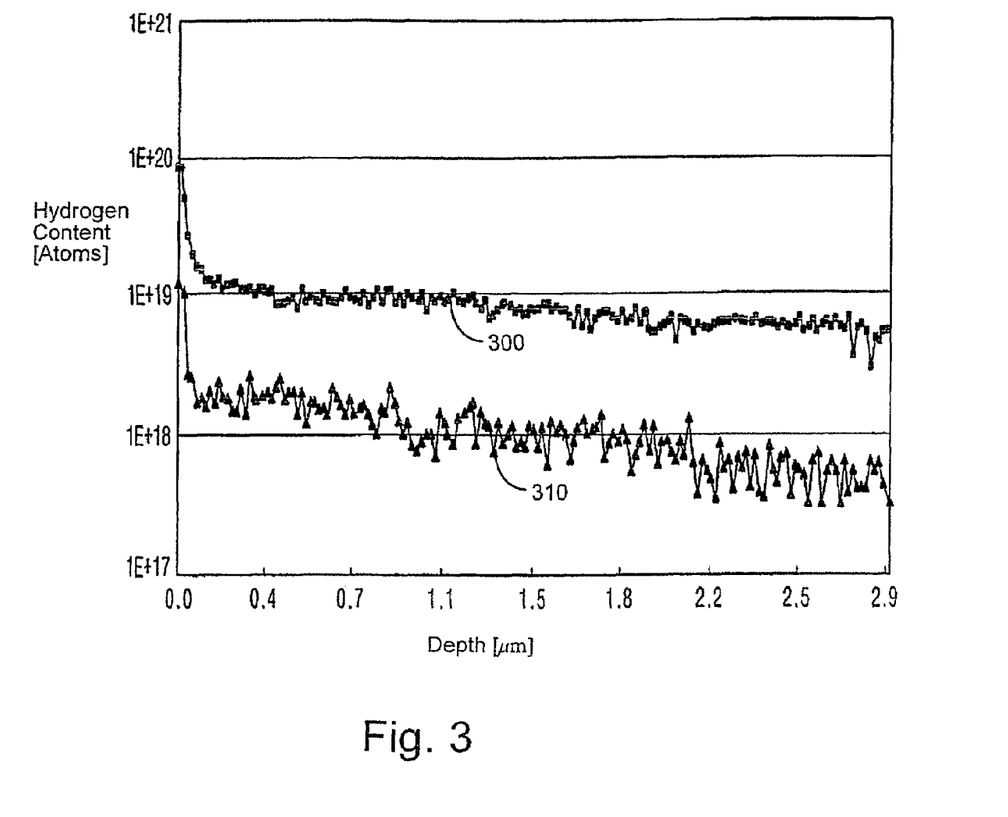
FIG. 3 is a graph illustrating the hydrogen ion content of an active structure and a field structure of a semiconductor device, which may correspond to the semiconductor device of FIG. 1, before and after a laser beam is used to heat those structures and reduce the hydrogen ion content therein in accordance with some embodiments of the present invention.

FIG. 3 is a graph illustrating the hydrogen ion content of an active structure and a field structure of a semiconductor device, which may correspond to the semiconductor device 100 of FIG. 1, before and after a laser beam is used to heat those structures and reduce the hydrogen ion content therein. Referring to FIG. 3, the line 300 illustrates the hydrogen ion content that may be found in the single crystalline active structure 30 and the field structure 14a before the second laser beam 43 is generated to reduce the hydrogen ion content therein. In sharp contrast, the line 310 illustrates the hydrogen ion content that may remain in the single crystalline active structure 30 and the field structure 14a after the second laser beam 43 has been used to heat the single crystalline active structure 30 and the field structure 14a to about 1300° C. to reduce the hydrogen ion content therein.

A plurality of gate patterns may then be formed on the single crystalline active structure 30. Impurities may be doped into the single crystalline active structure 30 to form source regions and drain regions therein. Because the single crystalline active structure 30 has the same crystalline lattice structure as the semiconductor substrate 10, defects may be at least substantially avoided at the interface between the single crystalline active structure 30 and the semiconductor substrate 10. The single crystalline lattice structure of the active structure 30 may reduce or prevent accumulation of holes and associated undesirable effects during the operation of a MOS transistor (e.g., avoid decreased potential barrier, decreased threshold voltage, and/or increased drain current in the MOS transistor 200), another type of transistor, or another electronic device formed thereon.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating a semiconductor device, the method comprising:
   providing a semiconductor substrate having a single crystalline structure within at least a defined region thereof;
   forming a thin layer on the semiconductor substrate;
   patterning the thin layer to form a plurality of spaced apart field structures and to expose therebetween portions of the semiconductor substrate having the single crystalline structure;
   forming a non-crystalline layer on the exposed portions of the semiconductor substrate having the single crystalline structure;
   planarizing the non-crystalline layer to expose upper surfaces of the field structures and define non-crystalline active structures from the non-crystalline layer between the field structures;
   generating a first laser beam that heats the non-crystalline active structures to a liquid phase to change them into single crystalline active structures having substantially the same single crystalline structure as the defined region of the semiconductor substrate;
   planarizing the single crystalline active structures and the field structures to align upper major surfaces of the single crystalline active structures and the field structures; and
   generating a second laser beam that heats the single crystalline active structures and the field structures to a temperature that is sufficiently high to substantially reduce impurity ions in upper surfaces of the single crystalline active structures and the field structures which were introduced therein by the planarization, and that is sufficiently low to not melt the active structures.

2. The method of claim 1, wherein the second laser beam is controlled to heat the single crystalline active structures and the field structures to a temperature that is sufficiently high to substantially reduce hydrogen and/or carbon ions in upper surfaces of the single crystalline active structures and the field structures.

3. The method of claim 1, wherein the first laser beam is generated to melt the non-crystalline active structures so that the single crystalline structure of the semiconductor substrate forms a seed layer which changes lattice parameters of the melted non-crystalline active structures to have substantially the same single crystalline structure as the defined region of the semiconductor substrate.

4. The method of claim 3, wherein the non-crystalline active structures are formed from amorphous silicon and/or polycrystalline silicon, and the first laser beam is generated to heat the non-crystalline active structures to a temperature above a melting point of silicon.

5. The method of claim 3, further comprising preheating the semiconductor substrate before generating the first laser beam to reduce a temperature gradient between the laser heated non-crystalline active structures and the semiconductor substrate.

6. The method of claim 5, wherein preheating the semiconductor substrate before generating the first laser beam comprises preheating the semiconductor substrate to above about 100° C. and maintaining the semiconductor substrate at one or more temperatures above about 100° C. while generating the first laser beam to reduce a temperature gradient between the laser heated non-crystalline active structures and the semiconductor substrate.

7. The method of claim 3, wherein the first laser beam is generated to heat the non-crystalline active structures for a time period in a range of between about one nano-second to about 1,000 nano-seconds so that the non-crystalline active structures are maintained in a melted form for a sufficiently brief time to not flow substantially across adjacent field regions.

8. The method of claim 7, wherein the first laser beam is generated to heat the non-crystalline active structures for a time period in a range of between about 5 nano-seconds to about 200 nano-seconds.

9. The method of claim 7, wherein the first laser beam is generated using a Nd Yttrium-Aluminum-Garnet (YAG) laser apparatus, a carbon laser apparatus, and/or an excimer laser apparatus.

10. The method of claim 1, wherein the non-crystalline film is formed from a material comprising amorphous silicon and/or polycrystalline silicon.

11. The method of claim 10, wherein the non-crystalline film is formed by a chemical vapor deposition (CVD) process comprising a silicon source gas including silane ($SiH_4$) and/or hexadichiorosilane ($Si_2H_6$).

12. The method of claim 1, wherein planarizing the non-crystalline layer to expose upper surfaces of the field structures comprises chemical mechanical polishing and/or etching the non-crystalline layer until upper surfaces of the field structures are exposed.

13. The method of claim 1, further comprising doping impurities into the non-crystalline active structures before the first laser beam is generated to change the non-crystalline active structures into single crystalline active structures.

14. The method of claim 13, wherein the non-crystalline active structures are doped with impurities selected from at least one of boron (B), phosphor (P), and arsenic (As).

15. The method of claim 13, wherein the non-crystalline active structures are doped with impurities using an in-situ doping process and/or an ion-implantation process.

16. The method of claim 1, further comprising forming an etch stop layer on the defined region of the semiconductor substrate, wherein the etch stop layer is formed from a material having an etching selectivity relative to a material of the field structures and wherein the thin layer is formed on the etch stop layer; and forming a spacer layer on sidewalls of the field structures after patterning the thin layer to form the field structures, wherein the spacer layer has an etching selectivity relative to a material of the field structures.

17. The method of claim 16, wherein the spacer layer is formed from silicon nitride and/or oxynitride (SiON) and the field structures are formed from silicon oxide.

18. The method of claim 16, wherein the etch stop layer is formed from silicon nitride and the field structures are formed from silicon oxide.

19. The method of claim 16, further comprising forming an etch mask pattern on the thin layer, wherein patterning the thin layer comprises etching the thin layer using the etch mask pattern as an etching mask to form the spaced apart field structures and expose therebetween portions of the etch stop layer on the semiconductor substrate and to expose the spacer layer on sidewalls of the field structures.

20. The method of claim 19, wherein forming an etch mask pattern comprises:
forming an amorphous layer on the thin layer;
forming a photoresist pattern on the amorphous layer and exposing regions of the thin layer over the defined region of the semiconductor substrate; and
etching the amorphous layer using the photoresist pattern as an etching mask to form a hard mask pattern that exposes regions of the thin layer, wherein patterning the thin layer comprises etching the thin layer using the hard mask pattern as an etching mask.

21. The method of claim 20, wherein forming an amorphous layer comprises forming a layer of silicon nitride on the thin layer or a layer of amorphous carbon and a layer of silicon nitride on the thin layer.

22. The method of claim 19, wherein the exposed regions of the thin layer are etched using an etching gas and/or an etching solution.

23. The method of claim 19, further comprising removing the exposed portions of the etch stop layer to expose portions of the semiconductor substrate while leaving the spacer layer on sidewalls of the field structures.

24. The method of claim 16, wherein forming a spacer layer on sidewalls of the field structures comprises depositing the spacer layer on the field structures and the exposed regions of the semiconductor substrate between the field structures, and removing the spacer layer from an upper major surface of the field structures and from regions of the semiconductor substrate between the field structures.

25. The method of claim 1, wherein the thin layer is formed from an oxide insulation material.

26. The method of claim 25, wherein the thin layer is formed from at least one of high density plasma-chemical vapor deposition (HDP-CVD) oxide, and silicon on glass (SOG), and/or undoped silicate glass (USG).

27. The method of claim 1, further comprising:
forming an etching mask on the field structures before forming the non-crystalline layer on the exposed portions of the semiconductor substrate; and
etching sidewalls of the field structures to enlarge at least the upper portion of a trench between the field structures.

* * * * *